United States Patent [19]

Lee et al.

[11] Patent Number: 5,700,626
[45] Date of Patent: Dec. 23, 1997

[54] METHOD FOR FORMING MULTI-LAYER RESIST PATTERN

[75] Inventors: Jun Seok Lee; Hun Hur; Young Jin Song, all of Seoul, Rep. of Korea

[73] Assignee: LG Semicon Co., Ltd., Chungcheongbuk-do, Rep. of Korea

[21] Appl. No.: 673,476

[22] Filed: Jul. 1, 1996

Related U.S. Application Data

[63] Continuation of Ser. No. 200,766, Feb. 23, 1994, abandoned.

[30] Foreign Application Priority Data

Jan. 12, 1994 [KR] Rep. of Korea ............... 429/1994

[51] Int. Cl.$^6$ ........................................... G03F 7/00
[52] U.S. Cl. ................. 430/296; 430/313; 430/314; 430/323; 430/324; 430/942; 156/659.11; 156/661.11; 250/492.3; 250/492.21
[58] Field of Search ................. 430/296, 311, 430/313, 314, 316, 317, 323, 324, 325, 329, 942; 156/643.1, 628.1, 646.1, 659.11, 661.11; 250/492.2, 492.3, 492.21

[56] References Cited

U.S. PATENT DOCUMENTS

| | | | |
|---|---|---|---|
| 4,557,797 | 12/1985 | Fuller | 156/643 |
| 4,642,672 | 2/1987 | Kitakata | 357/40 |
| 4,683,024 | 7/1987 | Miller | 156/643 |
| 4,826,943 | 5/1989 | Ito | 528/21 |
| 4,891,303 | 1/1990 | Garza | 430/312 |
| 5,030,549 | 7/1991 | Hashimoto | 430/296 |
| 5,169,494 | 12/1992 | Hashimoto | 156/661.1 |

*Primary Examiner*—Kathleen Duda
*Attorney, Agent, or Firm*—Morgan, Lewis & Bockius LLP

[57] ABSTRACT

A method for forming a multi-layer resist (MLR) pattern capable of preventing a generation of a charge-up effect in an exposure to electron beams and reducing alignment detect errors, and employing a silylation process, thereby achieving an improvement in resonance. The method includes the steps of forming a primary alignment mark on a silicon substrate formed with a cell part including a plurality of cell patterns having steps, depositing a lower deposition film over the silicon substrate, coating a lower resist film over the lower deposition film, subjecting a portion of the lower resist film to a light exposure and a development to form a secondary alignment mark, forming an intermediate insulating layer over the lower resist film, coating an upper resist film over the intermediate insulating layer to form a MLR film, subjecting the upper resist film to a light exposure to fork a latent image pattern at a non-exposed portion of the upper resist film, subjecting the resulting structure to a silylation to form a silylated layer over the upper resist film, etching the upper resist film to form an upper resist pattern and removing the silylated layer, patterning the intermediate insulating layer by use of the upper resist pattern as a mask, and etching the lower resist film by use of the intermediate insulating layer as a mask, thereby forming a MLR pattern.

9 Claims, 20 Drawing Sheets

METHOD FOR FORMING MULTI-LAYER RESIST PATTERN

This application is a continuation of application Ser. No. 08/200,766, filed Feb. 23, 1994, now abandoned.

BACKGROUND OF THE INVENTION

The present invention relates to photolithography processes, and more particularly to a method for forming a multi-layer resist pattern capable of achieving improvements in resonance and alignment of a multi-layer resist and preventing a generation of a charge-up effect in an exposure to electron beams.

As the design rule in device design for fabrication of integrated circuits becomes strict, steps present on surfaces of semiconductor devices serve as a limitation on pattern formation.

Where a highly integrated semiconductor device having steps is patterned by use of a photolithography process using a single-layer resist exclusively associated with electron beams, there are problems of a decrease in resistance property to dry etching and a degradation in resonance caused by a scattering effect due to a beam reflection from a substrate.

For solving problems associated with the steps, a multi-layer resist (MLR) process using double-layer or multi-layer resists has been proposed.

Such an MLR process is disclosed in U.S. Pat. Nos. 5,169,494, 4,826,943, and 4,891,303.

An example of an MLR process is illustrated in FIGS. 1A to 1D.

In accordance with the illustrated MLR process, a lower deposition film 15 is deposited on a substrate 10 which includes an alignment part 11 having alignment marks 12 and a cell part 13 having a plurality of cell patterns 14 with steps, as shown in FIG. 1A. Over the deposition film 15, a lower resist film 16, an interlayer insulating film 17 and an upper resist film 18 are sequentially coated to form an MLR film 19.

The lower deposition film 15 is an insulating film comprised of a polysilicon film, a metal film or an oxide film.

Thereafter, the MLR film 19 is subjected to a light exposure and developed, thereby forming an upper resist pattern 18', as shown in FIG. 1B.

Using the upper resist pattern 18' as a mask, the interlayer insulating film 17 is then etched to form an intermediate insulating film pattern 17', as shown in FIG. 1C. The lower resist film 16 is then etched under a condition that the intermediate insulating film pattern 17' is used as a mask, thereby forming a lower resist pattern 16', as shown in FIG. 1D. Accordingly, an MLR pattern 9' is obtained.

Using the MLR pattern 9' as a mask, the deposition film 15 as the lower layer is then etched. At this time, the upper resist pattern 18' is completely removed.

In the above-mentioned conventional MLR process, however, a charge-up effect is generated when the interlayer insulating is etched where the pattern formation is achieved by a direct writing of electron beams. The charge-up effect affects adversely the lower resist pattern.

As a result, the MLR pattern 19' has various problems such as a variation in critical dimension, a field deviation, and a line bridge. Such problems result in a degradation in resolution.

Furthermore, since the alignment marks 12 for the light exposure is disposed beneath the lower resist film 16 in accordance with the conventional MLR process, a key alignment is, carried out under a condition that the upper resist film has been coated. As a result, a single-color light applied to the substrate 10 for detecting the alignment mark 12 may generate a multiple interfere with the MLR layer 19 formed over the substrate 10. Due to such a multiple interfere, a detection error may occur in the finally reflected light. Consequently, a distortion of a signal may be generated.

Since the multiple interfere is varied depending on the thickness and the refractivity of each film of the MLR pattern, the intensity and the phase of the reflected light is dependent on the step condition.

Also, a proposal has been made in which an anti-reflection film is formed on the resist so as to enhance a light transmittivity, taking into consideration such a dependency of the film thickness in an mask alignment. This method is disclosed in U.S. Pat. No. 4,557,797 issued on Dec. 10, 1986.

Assuming that the wavelength of light applied is $\lambda$ and the refractivity of resist light is n, the reflectivity can be lowered when the refractivity n' of the anti-reflection film approximates to n. On the other hand, when the film thickness approximates to $k \cdot \lambda/4n'$ (k: an odd number), an improvement in signal detect is obtained.

In case of MLR films, other methods have been proposed for an improvement in alignment.

Three MLR processes capable of avoiding an occurrence of a charge-up effect in an exposure to electron beams are disclosed in U.S. Pat. Nos. 4,683,024, 5,030,549 and 4,642,672.

One of the MLR processes is a method wherein organo-silicon glass resin is coated over an intermediate insulating film of an MLR layer so as to prevent a reduction in critical dimension. Another MLR process is a method wherein a surface of a high molecular resist film is treated by a reducing material such as a metal, so as to avoid an occurrence of a charge-up effect when a pattern is formed on the high molecular organic resist film. The remaining MLR process is a method wherein a registration mark is comprised of a metal film, so as to prevent an occurrence of the charge-up effect.

SUMMARY OF THE INVENTION

Therefore, an object of the invention is to solve the above-mentioned problems encountered in the prior art and provide a method for forming a multi-layer resist pattern capable of preventing a generation of a charge-up effect in an exposure to electron beams and reducing alignment detect errors to achieve an improvement in alignment, and employing a silylation process, thereby achieving an improvement in resonance.

In accordance with the present invention, this object can be accomplished by providing a method for forming a multi-layer resist pattern, comprising the steps of: forming at least one primary alignment mark on a silicon substrate formed at one surface portion thereof with a cell part including a plurality of cell patterns having steps; depositing a lower deposition film over said silicon substrate; coating a lower resist film over said lower deposition film; subjecting said lower resist film to a light exposure and a development, thereby forming at least one secondary alignment mark; forming an intermediate insulating layer over the lower resist film; coating an upper resist film over said intermediate insulating layer, thereby forming a multi-layer resist film; subjecting said upper resist film to a light exposure, thereby forming a latent image pattern at an exposed portion of the upper resist film; subjecting the resulting structure to a silylation, thereby forming a silylated Layer over the upper resist film; etching the upper resist film to form an upper resist pattern and removing said silylated layer; patterning the intermediate insulating layer under a condition that said upper resist pattern is used as a mask; and etching the lower resist film under a condition that said patterned intermediate insulating layer is used as a mask, thereby forming a multi-layer resist pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2A to 2I are sectional views respectively illustrating a method for forming a multi-layer resist pattern in accordance with a first embodiment of the present invention.

Figure 1A:
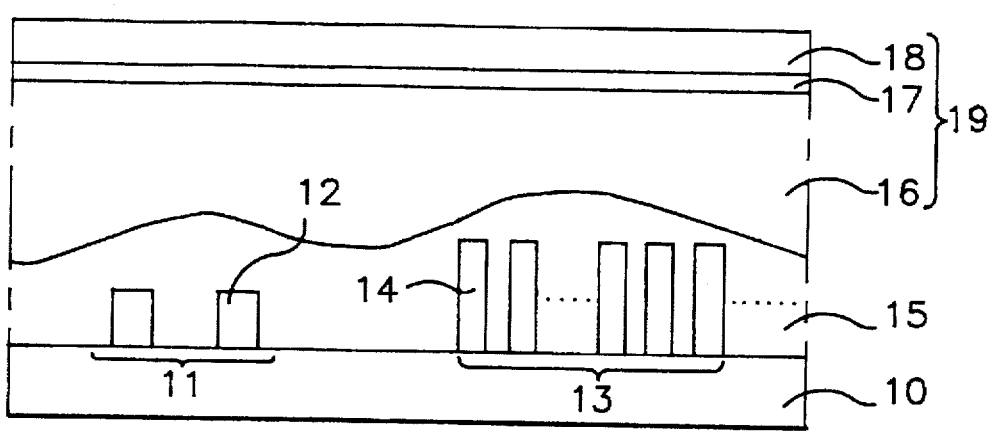
FIGS. 1A to 1D are sectional views respectively illustrating a conventional method for forming a multi-layer resist pattern.
Figure 1B:
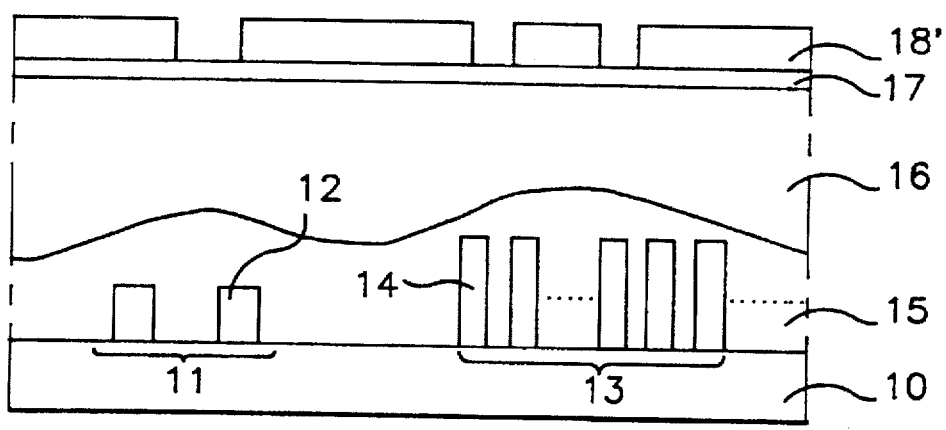
Figure 1C:
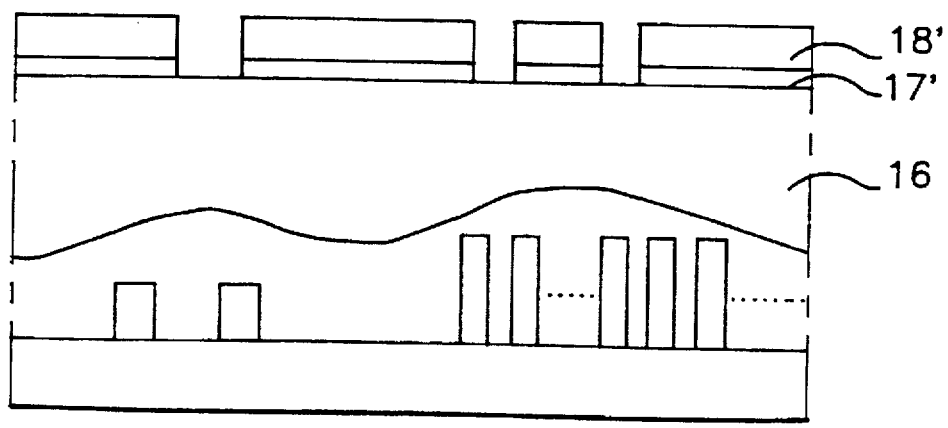
Figure 1D:
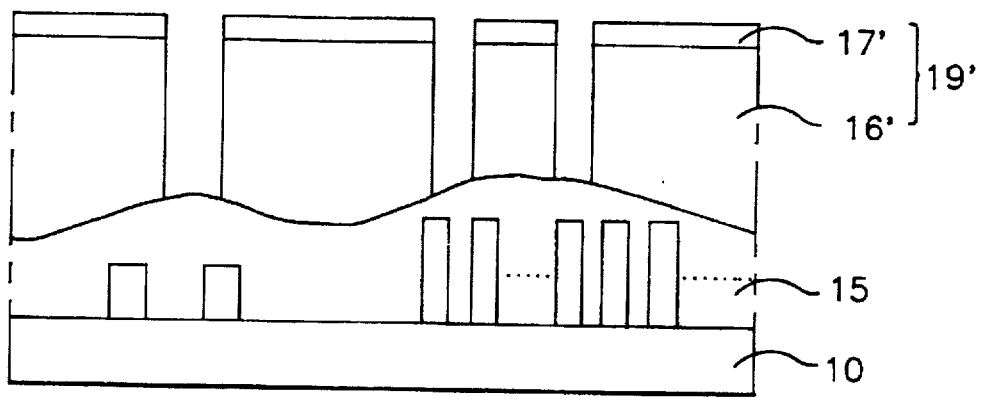
Figure 2A:
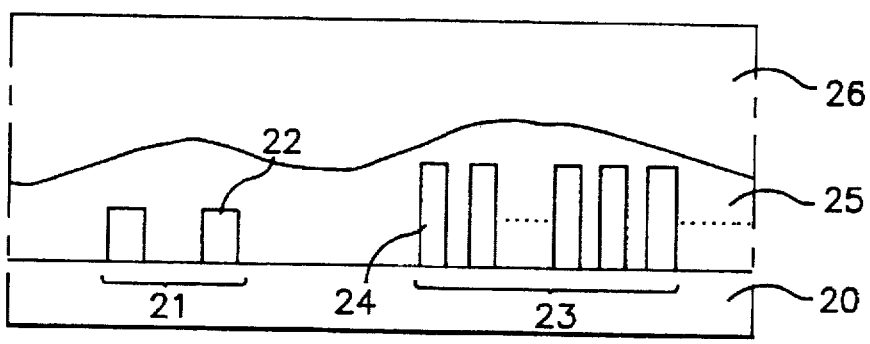
FIGS. 2A to 2I are sectional views respectively illustrating a method for forming a multi-layer resist pattern in accordance with a first embodiment of the present invention.

In accordance with this method, a lower deposition film 25 comprised of a metal film or an insulating film is deposited on a silicon substrate 20 which is formed at its surface with an alignment part 21 having primary alignment marks 22 and a cell part 23 having a plurality of cell patterns 24 with steps, as shown in FIG. 2A. Over the deposition film 25, a lower resist film 26 is coated to a thickness of 20,000 Å. The lower resist film 26 is an organic resist film capable of being subjected to a photoresist patterning.

Figure 2B:
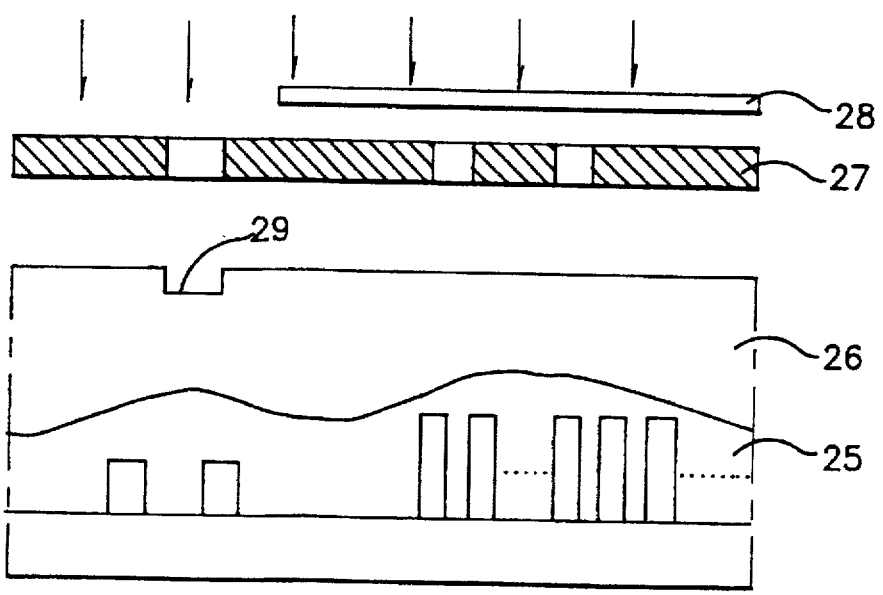

Thereafter, a mask 27 for a light exposure is disposed in position above the resulting structure, as shown in FIG. 2B. A blade 28 is also disposed above the mask 27 such that the cell part 23 is shielded. Subsequently, the lower resist film 26 is partially subjected to a light exposure and then developed. As a result, a secondary alignment mark 29 having a recess is formed on a portion of the surface of the lower resist film 26 corresponding to the alignment part 21.

Over the entire exposed surface of the resulting structure, an intermediate insulating layer 30 comprised of a spin on glass (SOG) film or a plasma enhanced oxide (PEOXIDE) film is then coated to a thickness of about 1,500 Å.

Figure 2C:
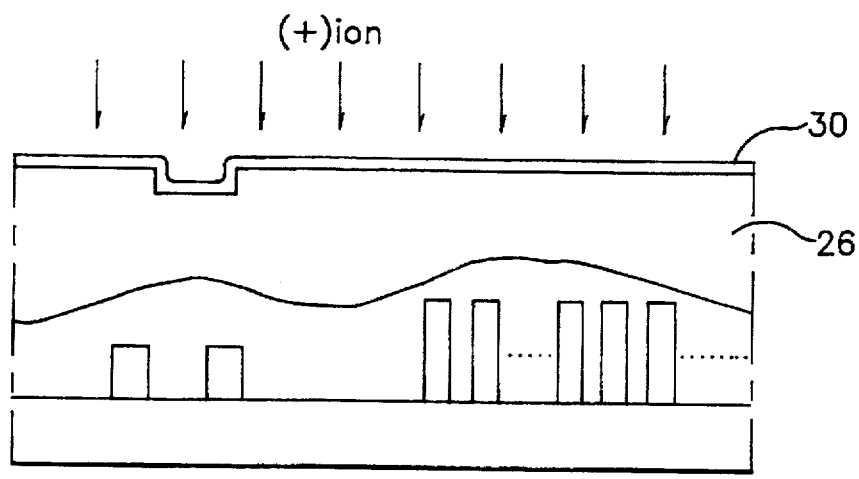

In order to prevent an occurrence of a charge-up effect in an exposure to electron beams, the resulting structure is subjected to an $O_2^+$ ashing under a condition using a pressure of 300 to 700 mT, a high frequency power of 100 to 700 W and a temperature of 25° C., as shown in FIG. 2C. In place of $O_2^+$, $H^+$ may be used. As an ion implantation condition for the $H^+$ ashing, an accelerated voltage of 10 to 70 kV and a dose amount of $1\times10^{14}$ to $1\times10^{18}$ ions/cm$^2$ are used. As a result, the surface of the intermediate insulating layer 30 exhibits a positively charged property.

Figure 2D:
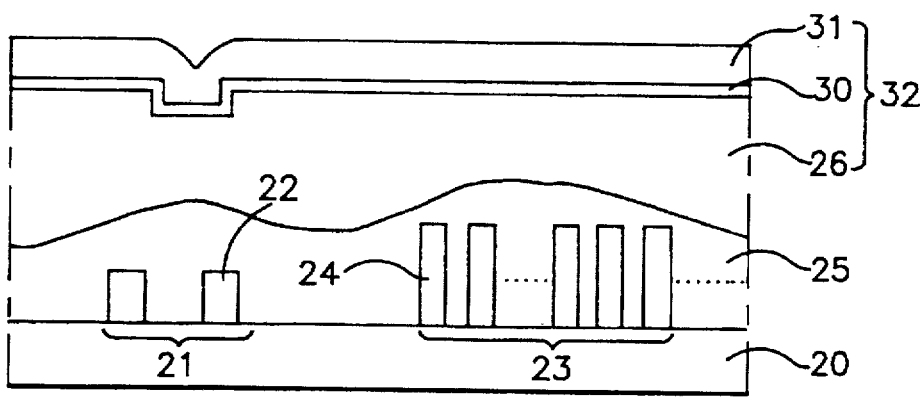
Figure 2E:
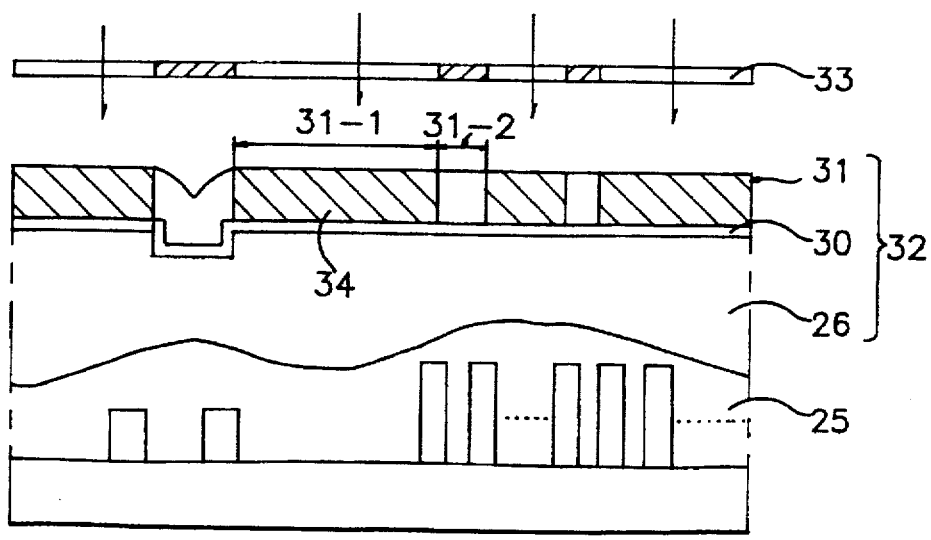

Over the intermediate insulating layer 30, an upper resist film 31 is coated to form an MLR film 32, as shown in FIG. 2D. The resultant structure is then subjected to a light exposure under a condition that a mask 33 for the light exposure is used, as shown in FIG. 2E. At this time, no blade is used. By this treatment, the upper resist film 31 is divided into an exposed part 31-1 and a non-exposed part 31-2. The upper resist film 31 also has a latent image pattern 34 at its pattern region corresponding to the cell part 23 and the alignment part 21, that is, at its exposed part 31-1. The upper resist film 31 is an Organic resist film capable of being subjected to a photoresist patterning.

Figure 2F:
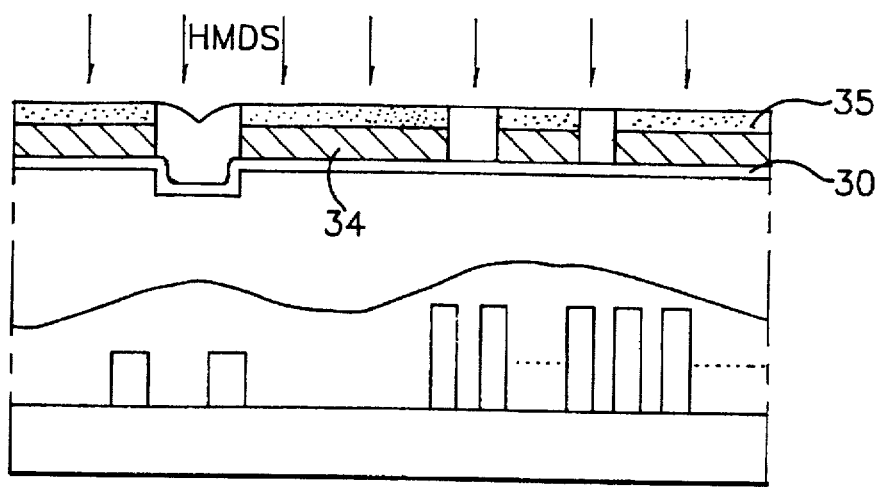

After completion of the light exposure, the resultant structure is subjected to a silylation process in a hexa methyl disilazane (HMDS) atmosphere, as shown in FIG. 2F. By the silylation, silicon atoms are diffused in the surface of the exposed part 31-1 of the upper resist film 31, thereby forming a silylated layer 35. The purpose of the silylation is to improve the resonance of the upper resist film 31. The silylated layer 35 is a silicon containing layer and serves as an etch mask in an $O_2$ dry etching.

Figure 2G:
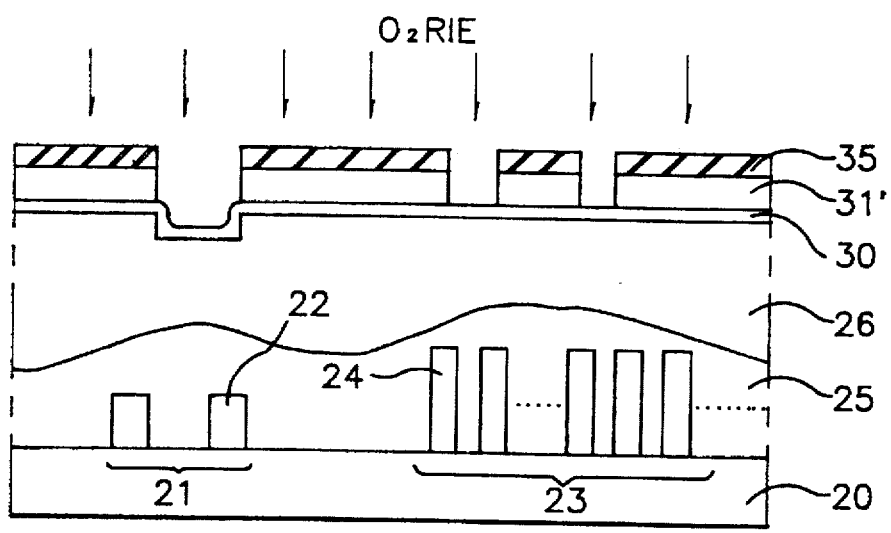

Subsequently, the non-exposed part 31-2 of the upper resist film 31 is dry-etched by use of an $O_2$ reactive ion etching (RIE) process, thereby forming an upper resist pattern 31', as shown in FIG. 2G. In the $O_2$ dry etching, the silylated layer 35 which is the silicon-containing layer is changed into an oxide film exhibiting an increased resistance to the $O_2$ RIE. As a result, the silylated layer 35 can serve as an etch mask for selectively removing only the non exposed part 31-2 of the upper resist film 31 except for the exposed part 31-1.

Figure 2H:
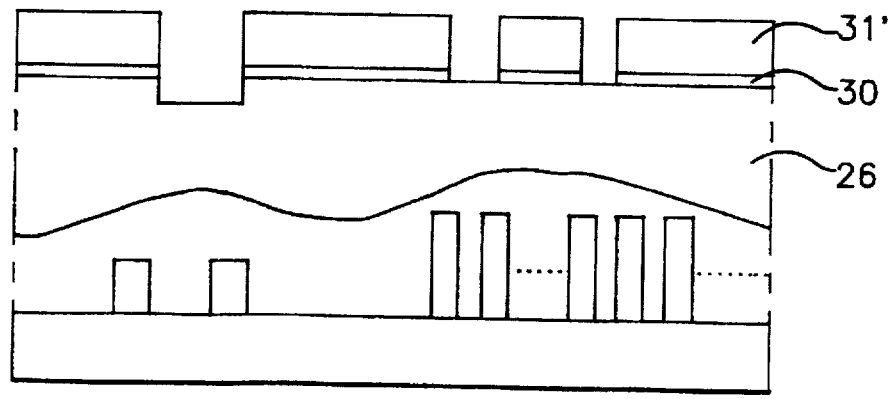
Figure 2I:
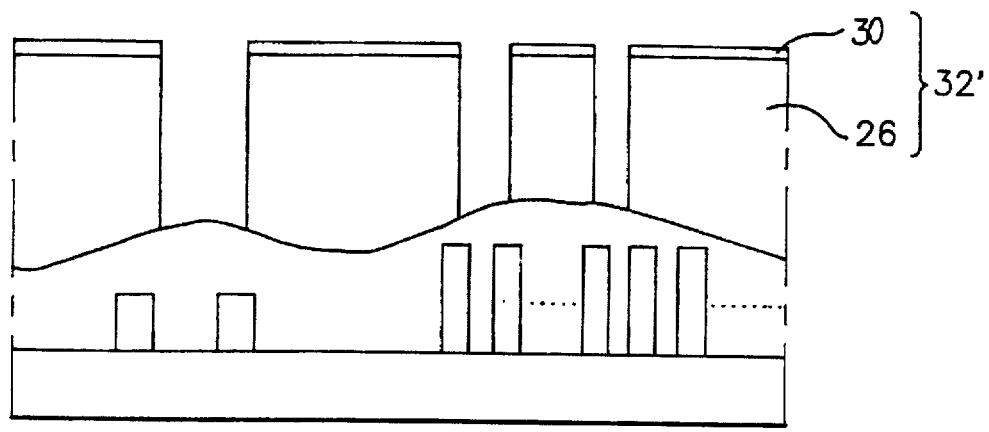

After the removal of the silylated layer 35, the intermediate insulating layer 30 is etched under a condition that the upper resist pattern 31' is used as a mask, as shown in FIG. 2H. Using the intermediate insulating layer 30 as a mask, the lower resist film 26 is then etched, thereby forming a MLR pattern 32'.

In accordance with the first embodiment of the present invention, alignment marks 29 are formed on the surface of the lower resist film 26, in addition to the alignment marks 22 formed on the silicon substrate 20. Accordingly, an improvement in alignment can be obtained because both two kinds of alignment marks can be aligned in the alignment step carried out after coating the upper resist film. It is also possible to avoid an occurrence of the charge-up effect in an exposure to electron beams because the intermediate insulating layer 30 exhibits a positively charged property at its surface. The resonance can be more improved by the silylated layer formed on the upper resist film by the silylation.

FIGS. 3A to 3I are sectional views respectively illustrating a method for forming a multi-layer resist pattern in accordance with a second embodiment of the present invention. This method is substantially similar to that of the first embodiment. In FIGS. 3A to 3I, elements corresponding to those in FIGS. 2A to 2I are denoted by the same reference numerals.

Figure 3A:
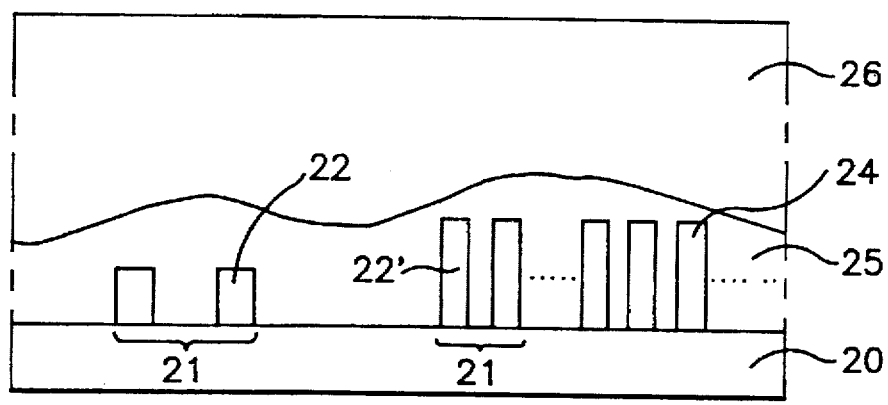
FIGS. 3A to 3I are sectional views respectively illustrating a method for forming a multi-layer resist pattern in accordance with a second embodiment of the present invention.
Figure 3B:
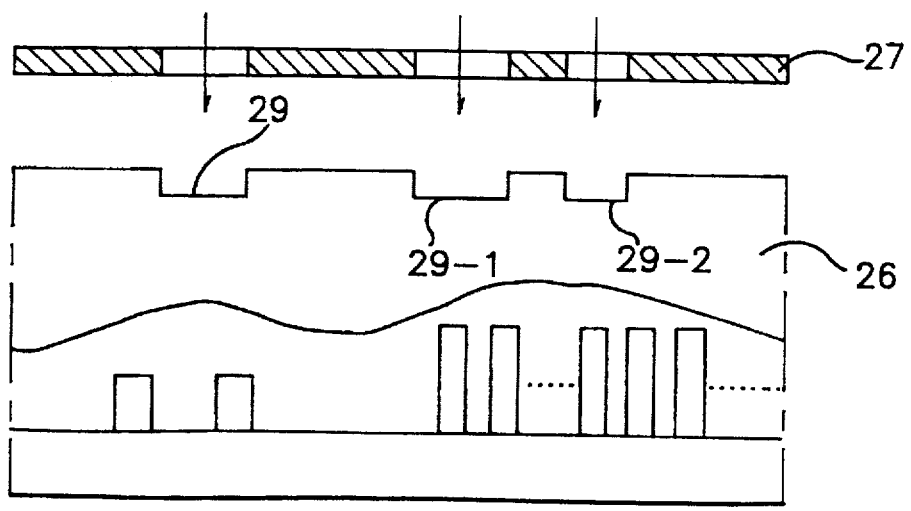
Figure 3C:
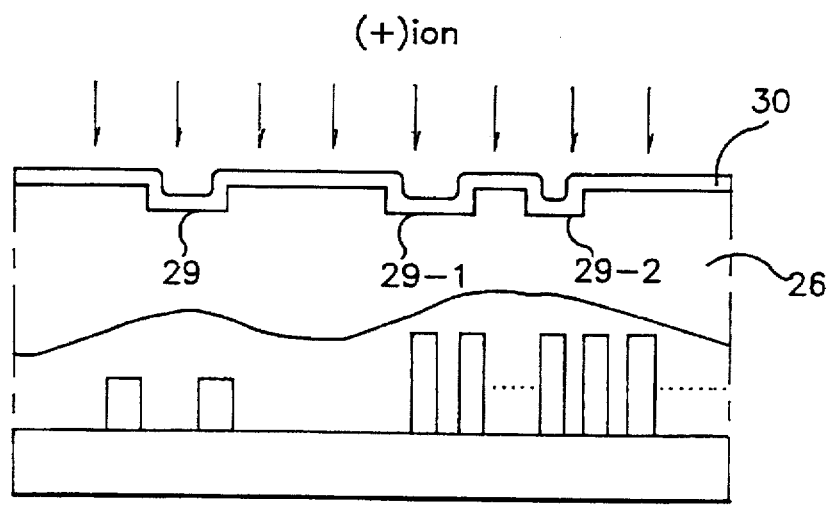
Figure 3D:
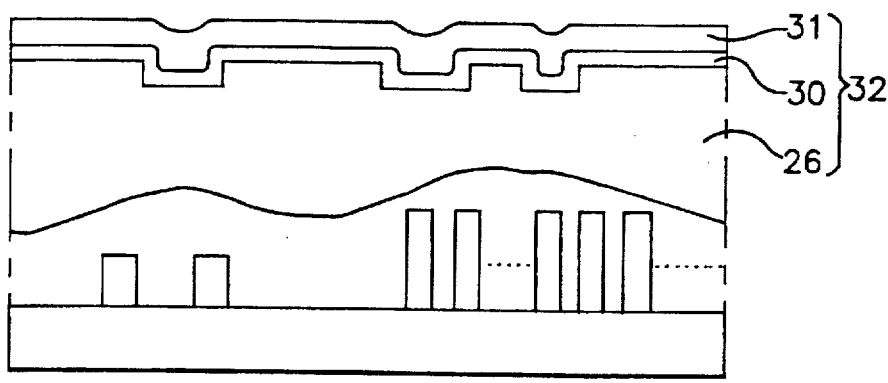
Figure 3E:
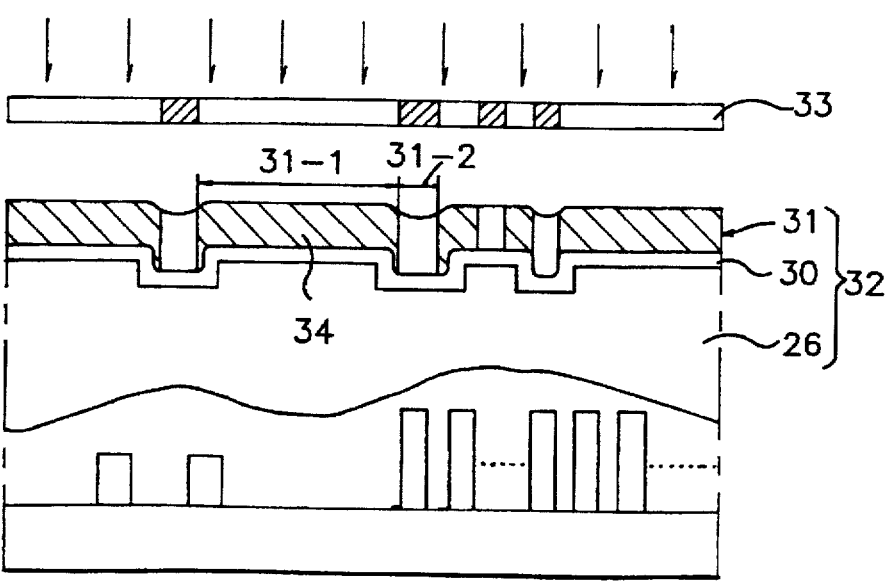
Figure 3F:
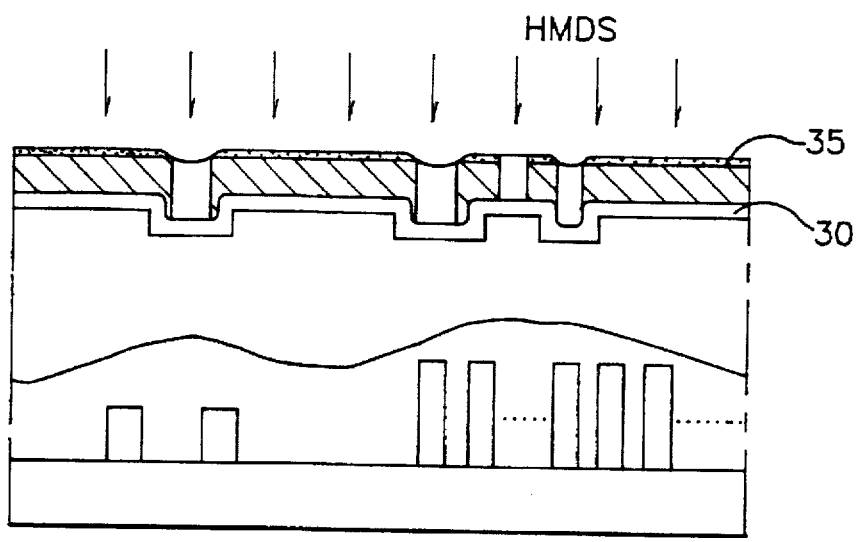
Figure 3G:
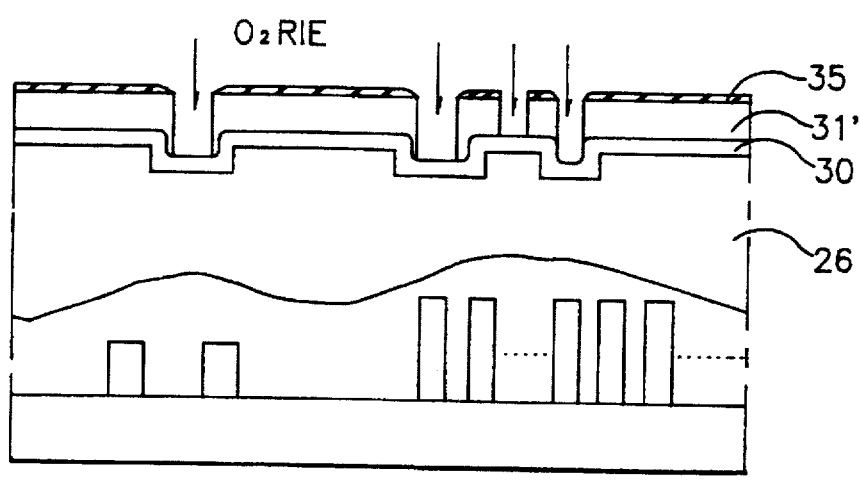
Figure 3H:
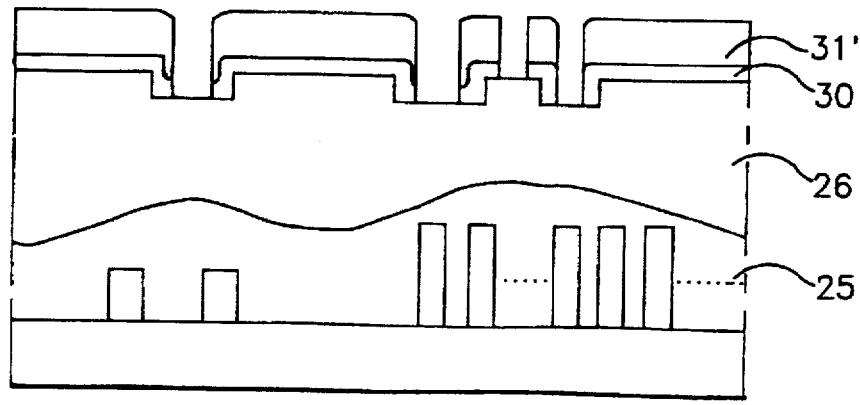
Figure 3I:
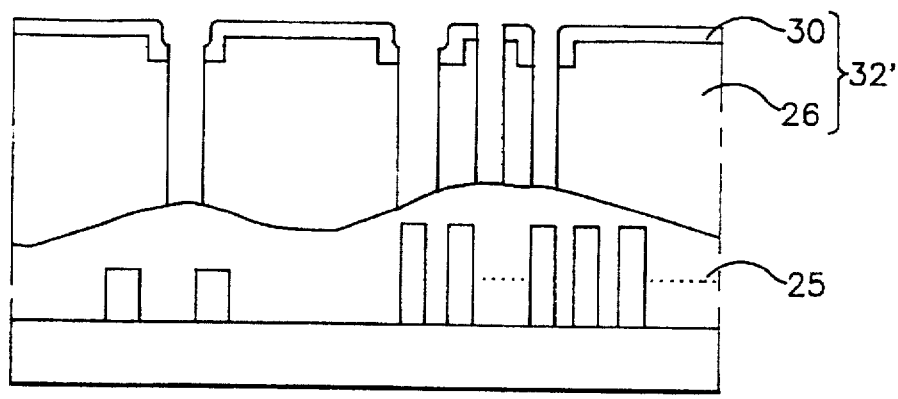

In accordance with the method of the second embodiment, an alignment part 21' having alignment marks 22' is formed on the cell part 23 of the substrate 20 which also has the alignment part 21 having the alignment marks 22, as shown in FIG. 3A. Accordingly, alignment parts 29-1 and 29-2 are formed on a surface portion of the lower resist film 26 corresponding to the alignment part 21' of the substrate 20, in addition to the alignment mark 29 formed on the surface portion of the lower resist film 26 corresponding to the alignment marks 22 of the alignment part 21, as shown in FIG. 3B.

In other words, the alignment marks 29, 29-1 and 29-2 are formed on the lower resist film 26 by subjecting the lower resist film 26 to a light exposure and a development only using the mask 27 for the light exposure without use of the blade 28, in accordance with the second embodiment.

Subsequent steps to the formation of the lower resist film 26 are the same as those of the first embodiment.

In accordance with the second embodiment, errors in alignment detect can be more reduced by virtue of the additional provision Of the alignment marks 22' formed in the cell part 23. Accordingly, the second embodiment is advantageous in formation of fine patterns over the first embodiment.

FIGS. 4A to 4I are sectional views respectively illustrating a method for forming a multi-layer resist pattern in accordance with a third embodiment of the present invention. In FIGS. 4A to 4I, elements corresponding to those in FIGS. 2A to 2I are denoted by the same reference numerals.

Figure 4A:
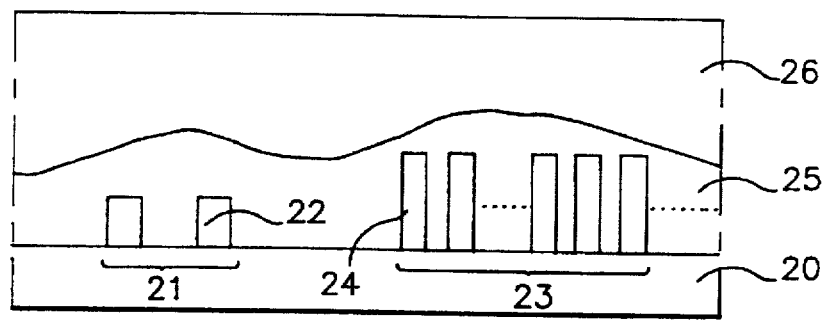
FIGS. 4A to 4I are sectional views respectively illustrating a method for forming a multi-layer resist pattern in accordance with a third embodiment of the present invention.

In accordance with this method, a lower deposition film 25 comprised is deposited on a silicon substrate 20 which is formed at its surface with an alignment part 21 having alignment marks 22 and a cell part 23 having a plurality of cell patterns 24 with steps, as shown in FIG. 4A. Over the deposition film 25, a lower resist film 26 is coated.

Figure 4B:
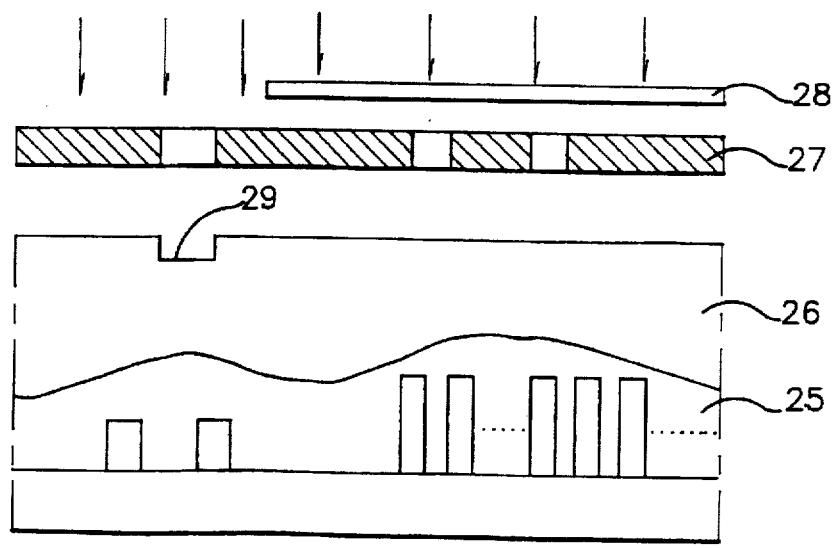

Thereafter, a mask 27 for a light exposure is disposed in position above the resulting structure, as shown in FIG. 4B. A blade 28 is also disposed above the mask 27 such that the cell part 23 is shielded. Subsequently, the lower resist film 26 is partially subjected to a light exposure and then developed. As a result, an alignment mark 29 is formed on a portion of the surface of the lower resist film 26 corresponding to the alignment marks 22.

Figure 4C:
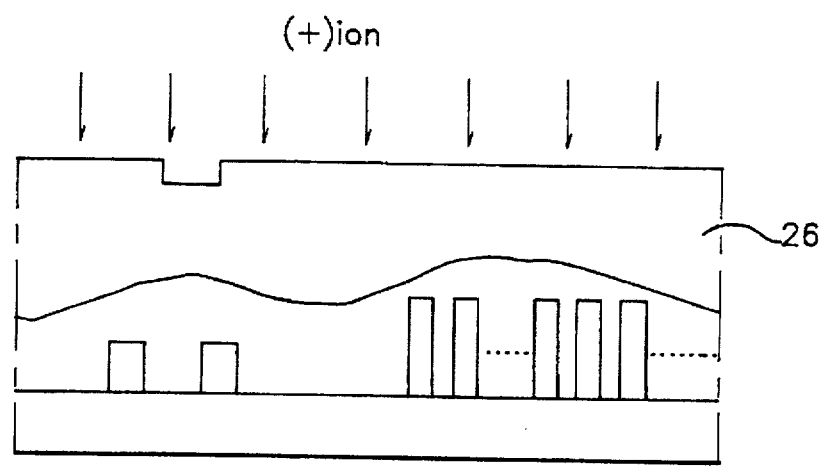

After the formation of the alignment mark 29 on the lower resist film 26, the surface of the lower resist film 26 is charged by positive ions, as shown in FIG. 4C.

Figure 4D:
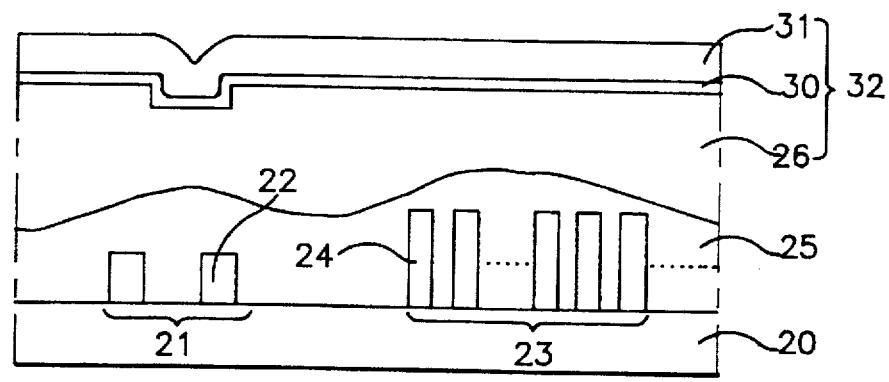
Figure 4E:
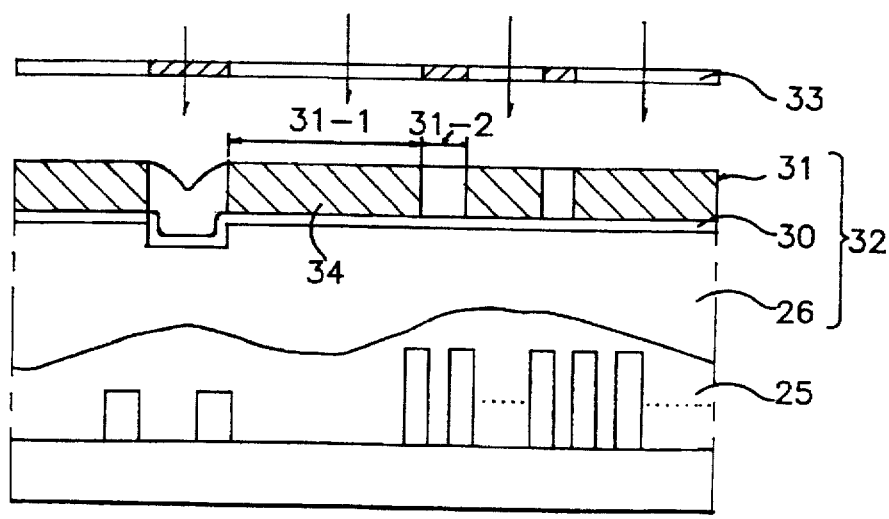
Figure 4F:
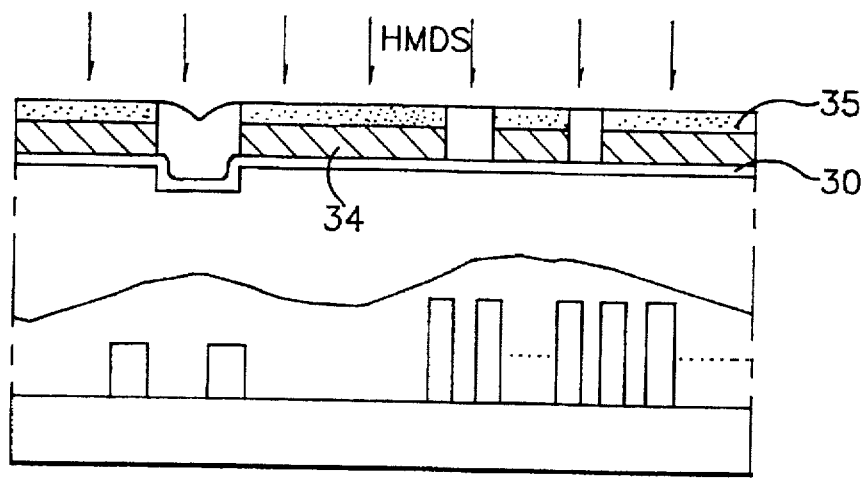
Figure 4G:
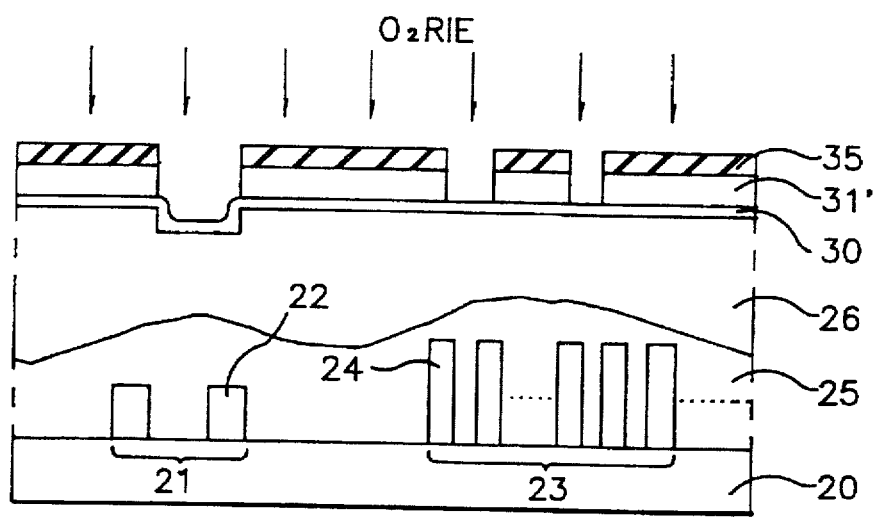
Figure 4H:
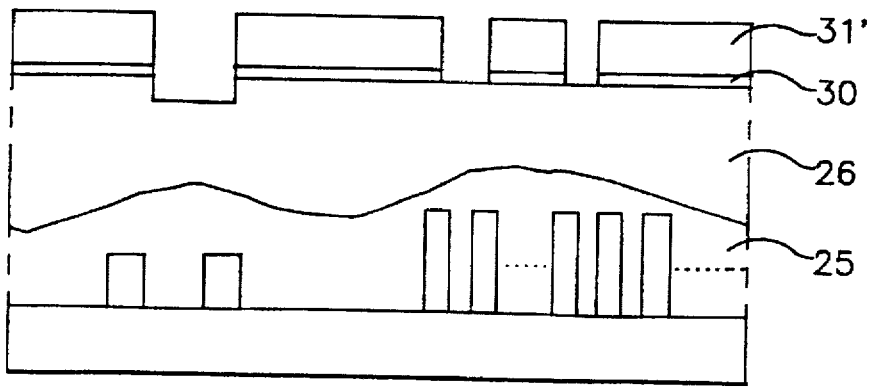
Figure 4I:
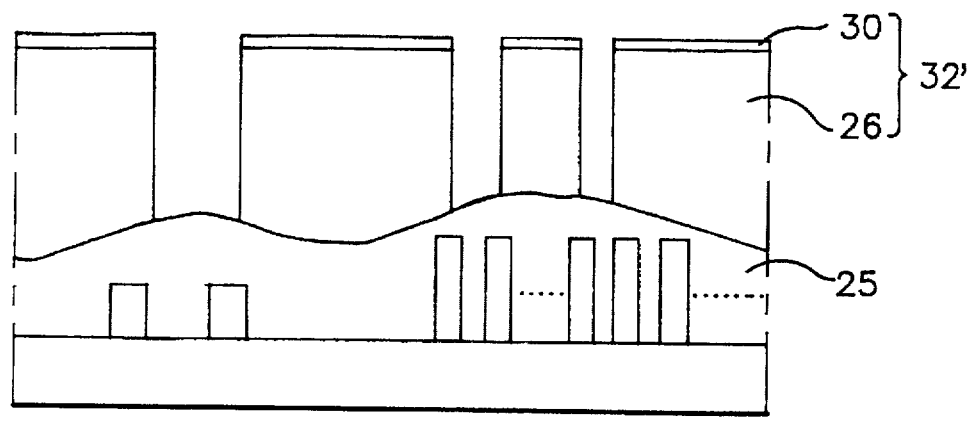

Then, an intermediate insulating layer 30 is then coated over the resulting structure, as shown in FIG. 4D. Over the intermediate insulating layer 30, an upper resist film 31 is coated. Subsequent steps are the same as those of the first embodiment.

In accordance with the third embodiment, the charge-up effect occurring in the exposure to electron beams is reduced by charging the surface of the lower resist film 26 by positive ions, as different from the first embodiment wherein the surface of the intermediate insulating layer 30 is charged by positive ions.

FIGS. 5A to 5J are sectional views respectively illustrating a method for forming a multi-layer resist pattern in accordance with a fourth embodiment of the present invention. In FIGS. 5A to 5J, elements corresponding to those in FIGS. 2A to 2I are denoted by the same reference numerals.

Figure 5A:
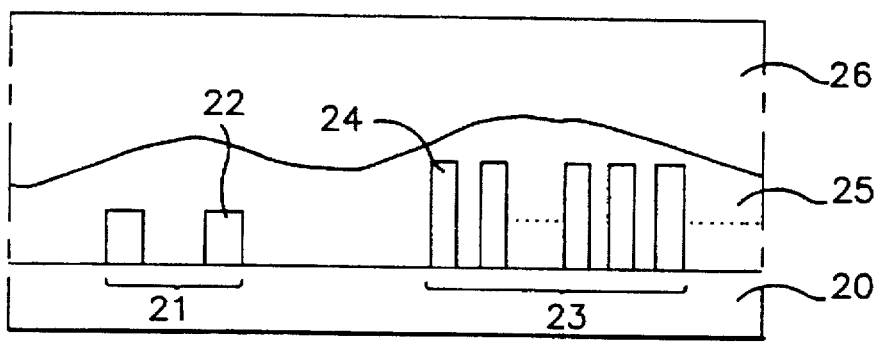
FIGS. 5A to 5J are sectional views respectively illustrating a method for forming a multi-layer resist pattern in accordance with a fourth embodiment of the present invention.
Figure 5B:
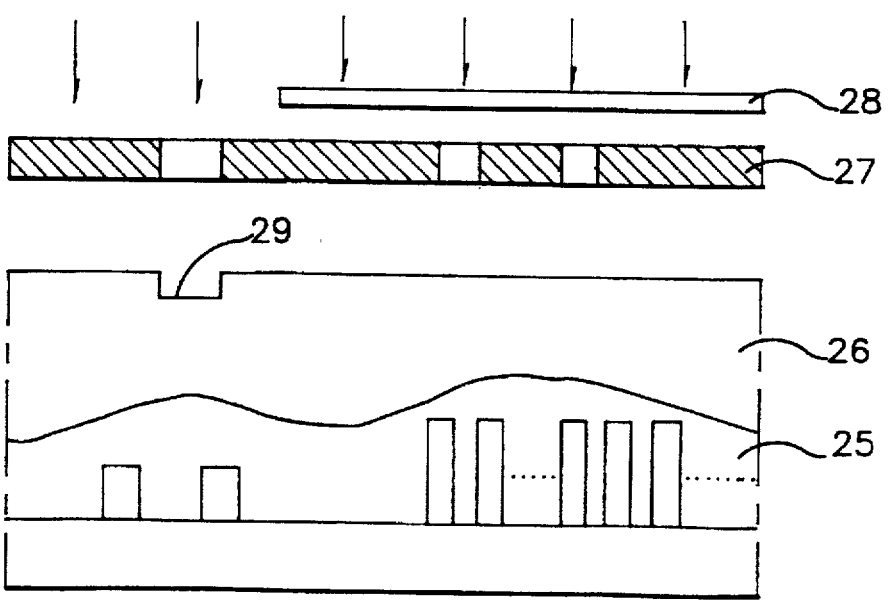
Figure 5C:
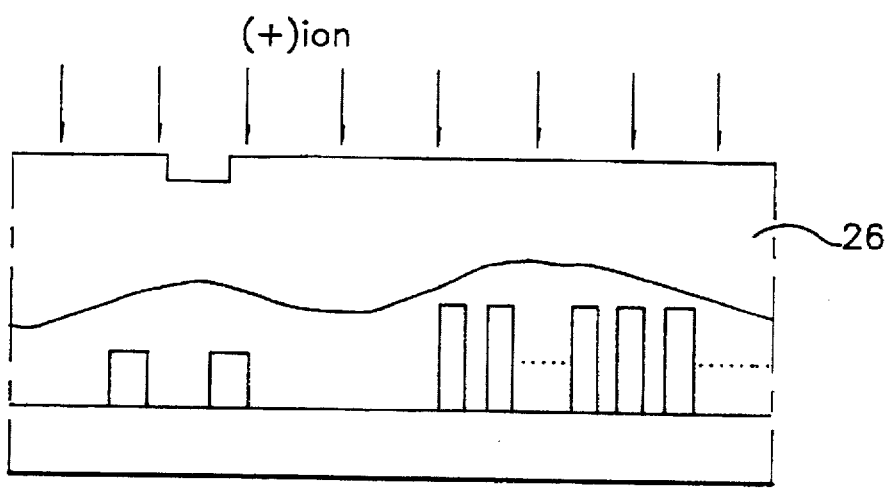
Figure 5D:
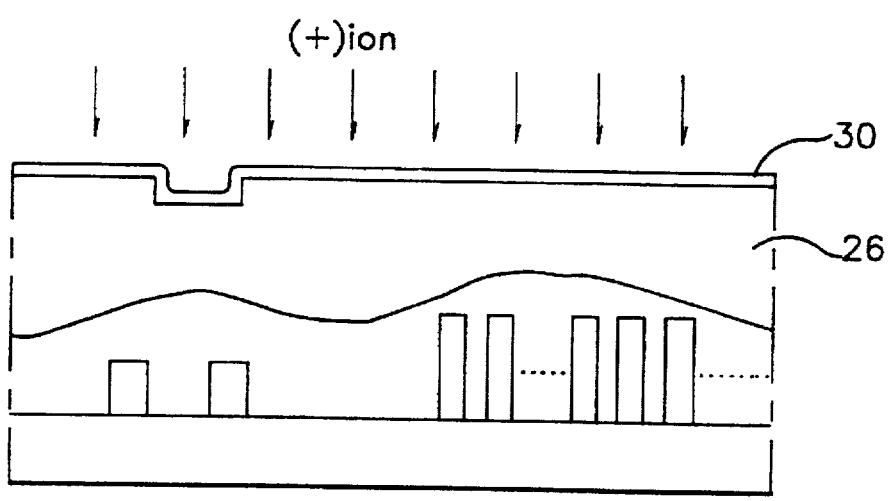
Figure 5E:
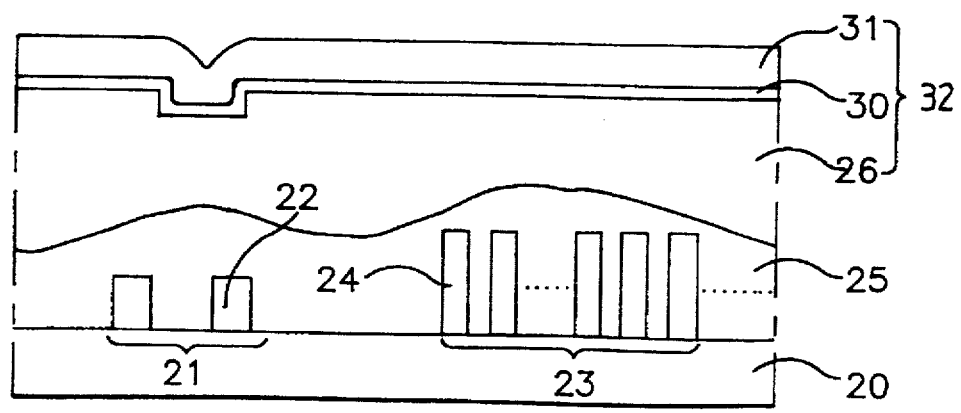
Figure 5F:
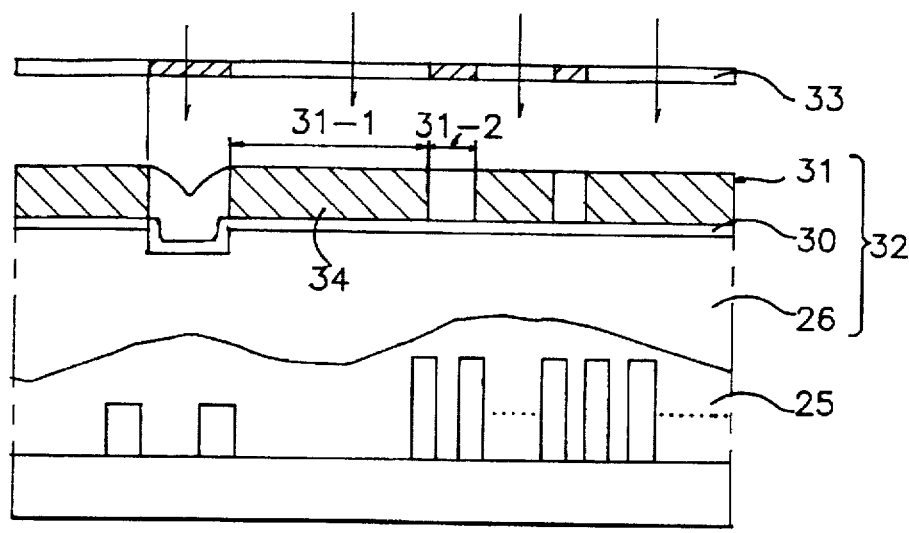
Figure 5G:
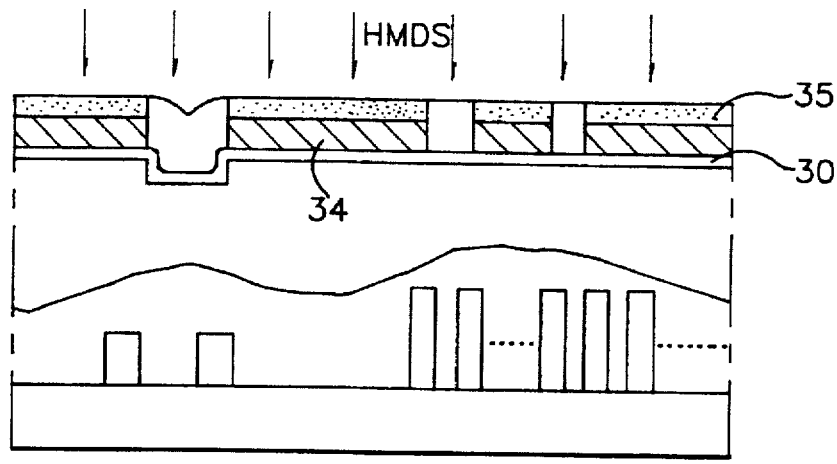
Figure 5H:
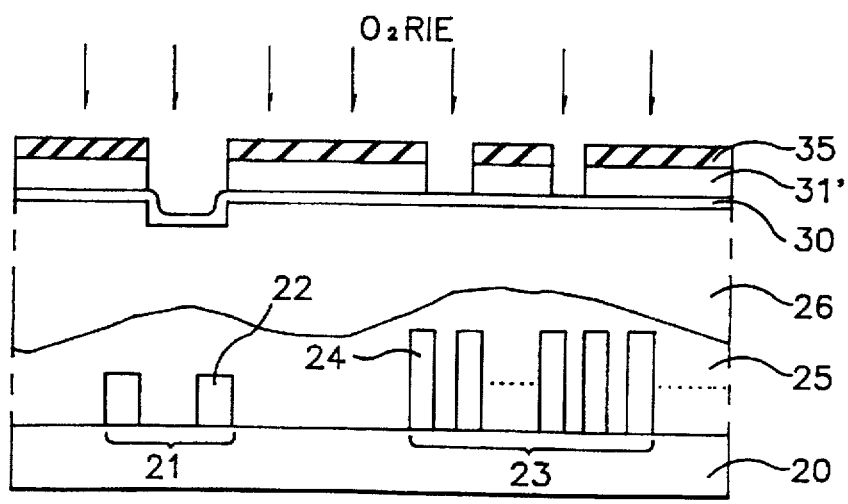
Figure 5I:
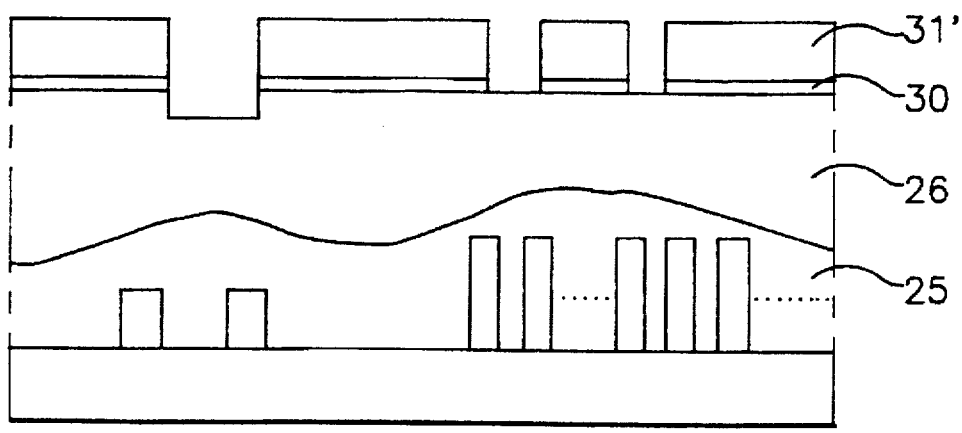
Figure 5J:
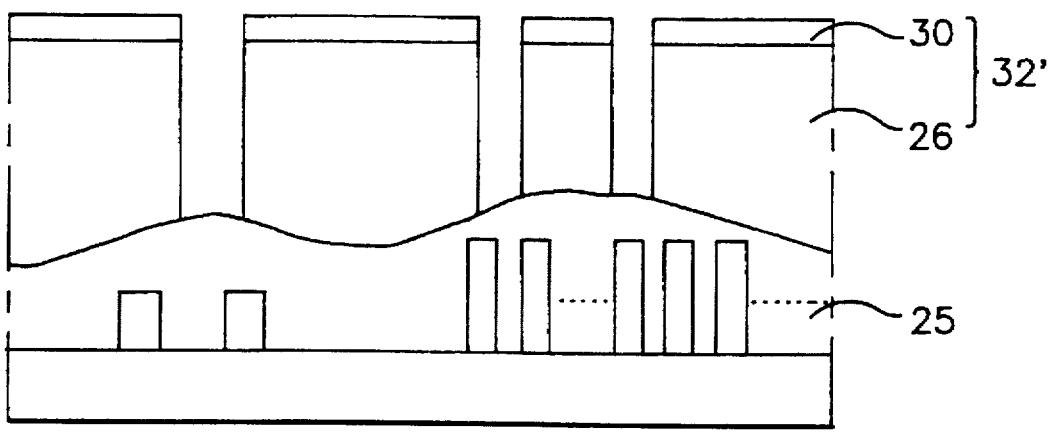

In accordance with this method, an alignment mark 29 is formed on a surface portion of a lower resist film 26 corresponding to alignment marks 22 formed on the substrate 20 in the same manner as that in the first embodiment, as shown in FIG. 5B. After the formation of the alignment mark 29, the surface of the lower resist film 26 is charged by positive ions, as shown in FIG. 5C.

Thereafter, an intermediate insulating layer 30 is deposited over the lower resist film 26. The intermediate insulating layer 30 is then charged by positive ions. As a result, it is possible to avoid an occurrence of the charge-up effect in an exposure to electron beams.

FIGS. 6A to 6I are sectional views respectively illustrating a method for forming a multi-layer resist pattern in accordance with a fifth embodiment of the present invention. In FIGS. 6A to 6I, elements corresponding to those in FIGS. 2A to 2I are denoted by the same reference numerals.

Figure 6A:
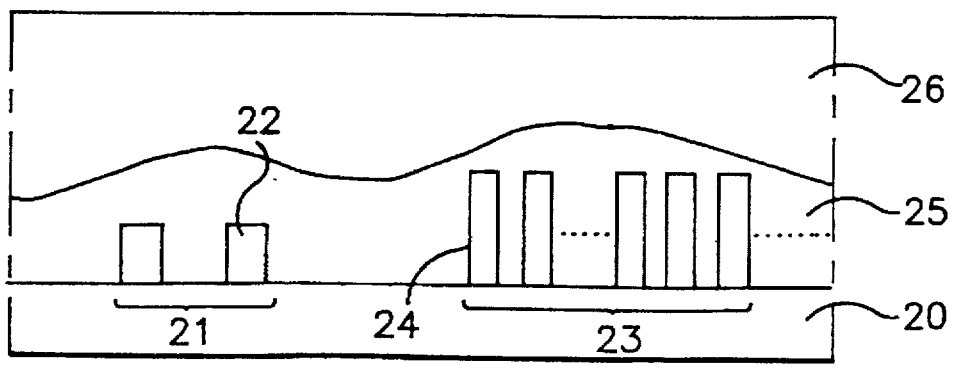
FIGS. 6A to 6I are sectional views respectively illustrating a method for forming a multi-layer resist pattern in accordance with a fifth embodiment of the present invention.
Figure 6B:
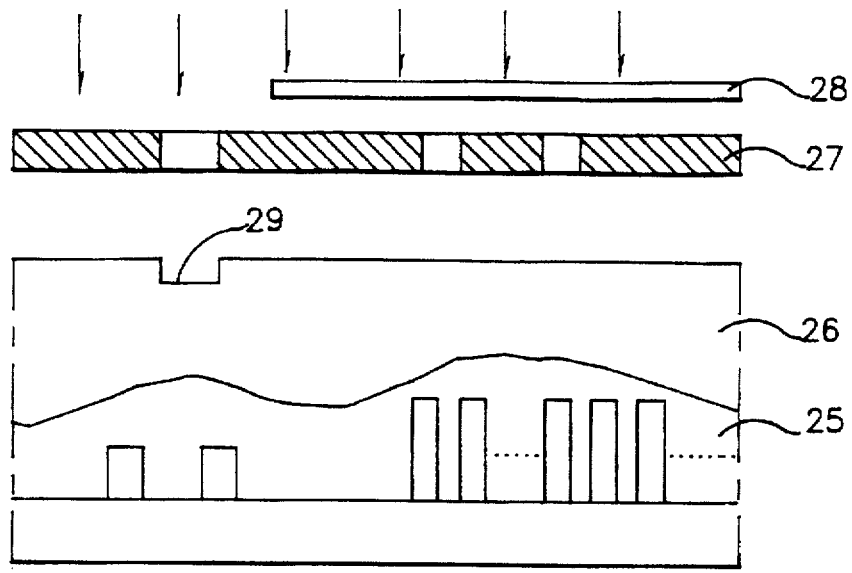
Figure 6C:
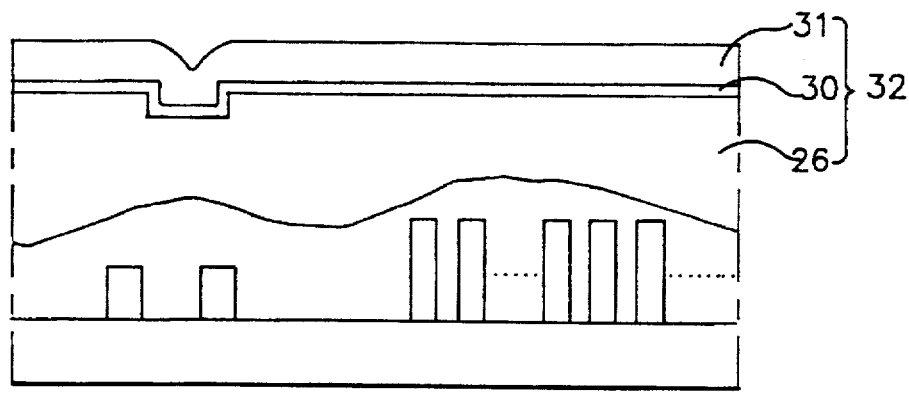
Figure 6D:
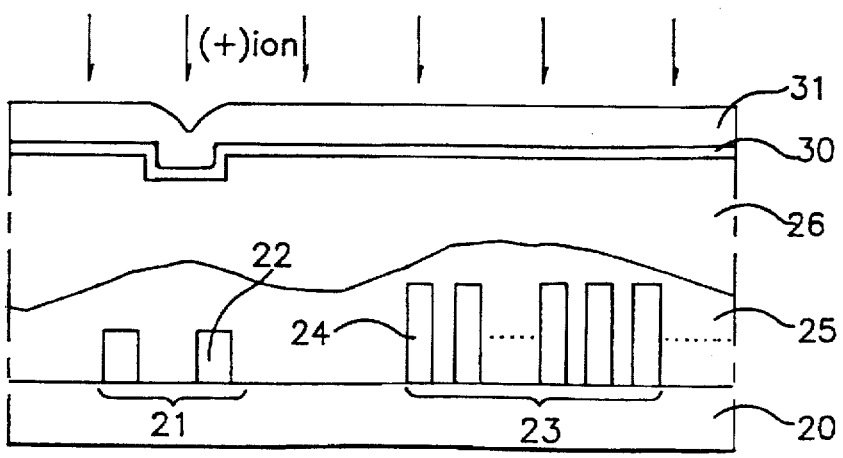
Figure 6E:
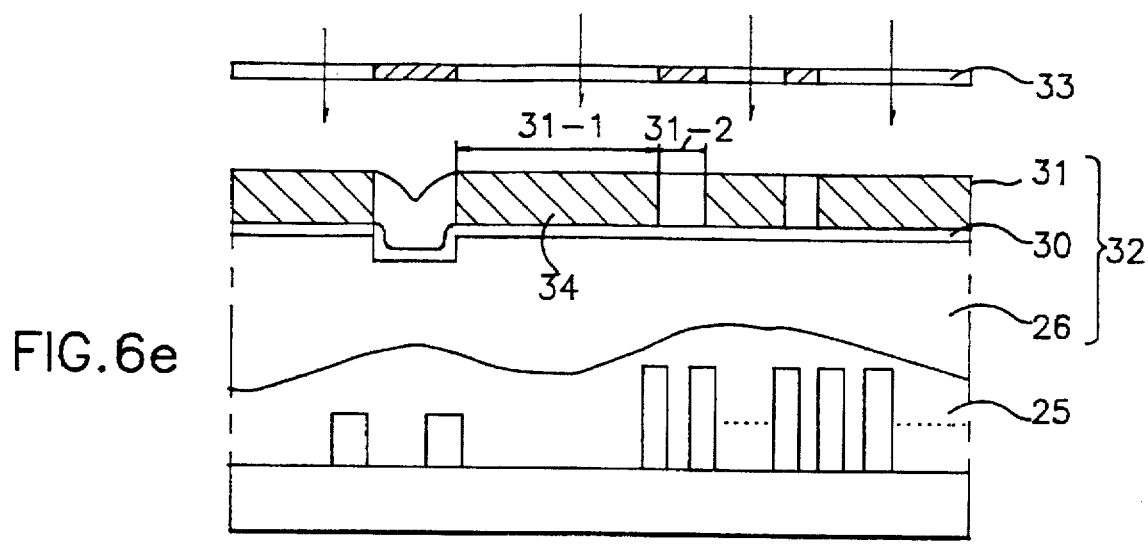
Figure 6F:
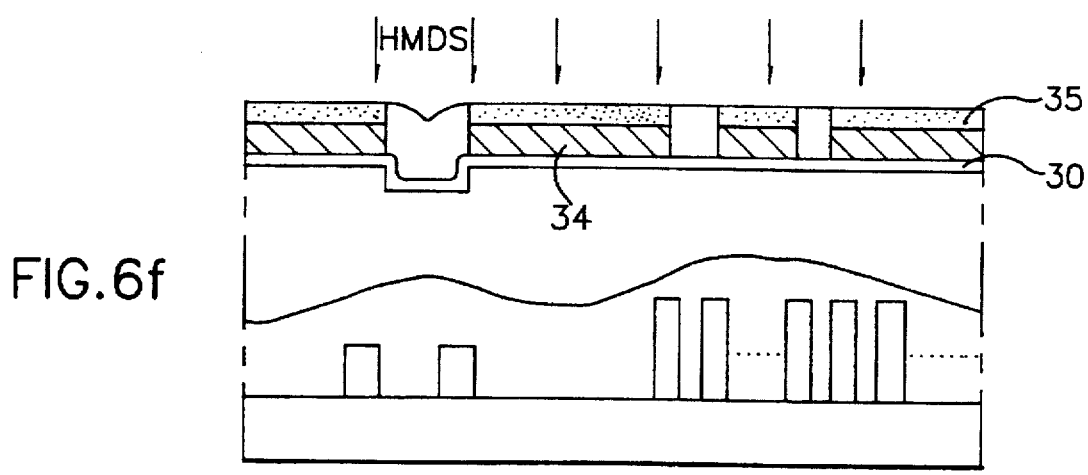
Figure 6G:
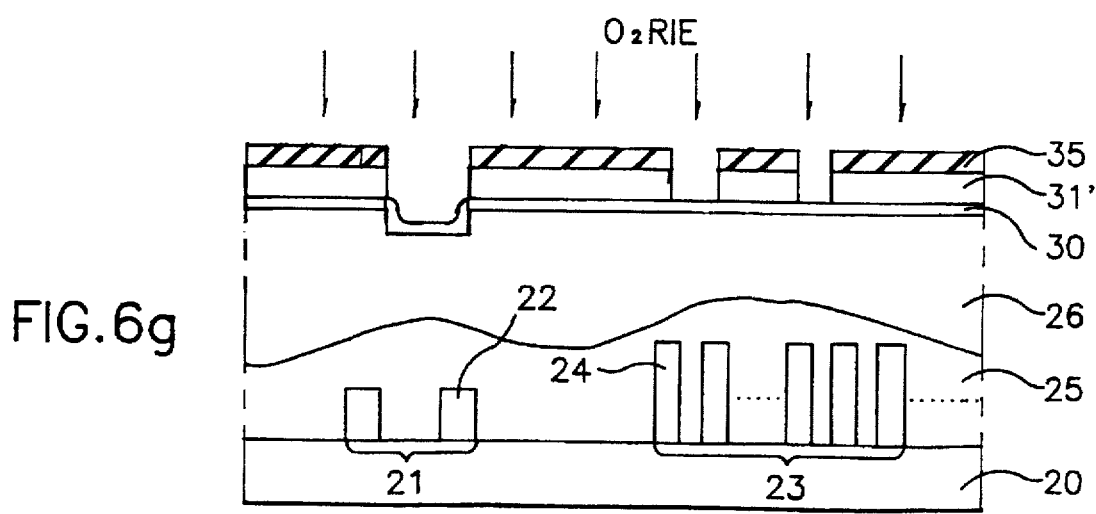
Figure 6H:
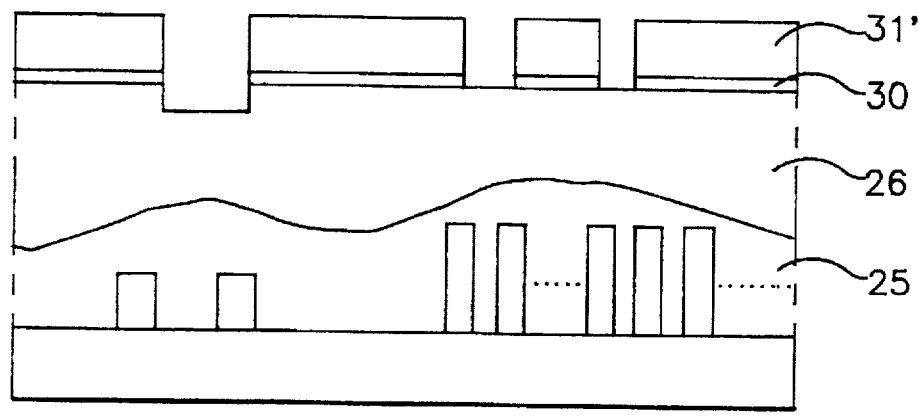
Figure 6I:
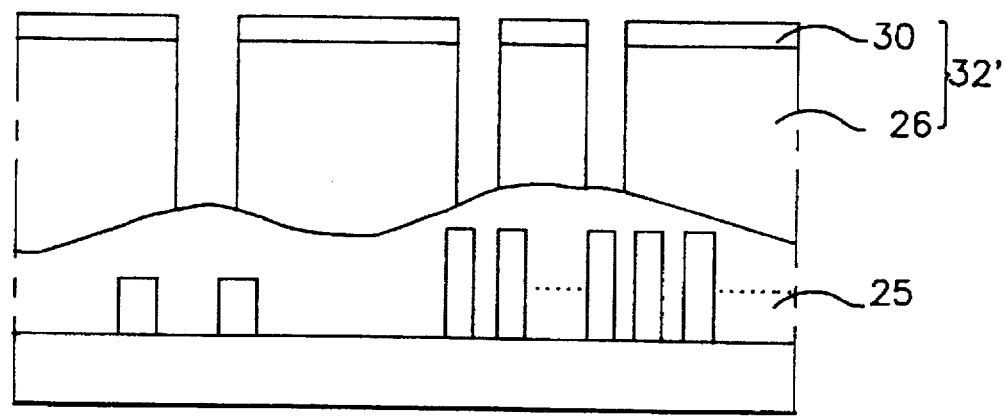

In accordance with this method, an MLR film 32 is formed by forming an upper resist film 31 over the intermediate insulating layer 30 in the same manner as in the first embodiment, as shown in FIG. 6C. Thereafter, the surface of the MLR film 32 is charged by positive ions, as shown in FIG. 6D.

Subsequent steps are the same as those of the first embodiment.

In accordance with the fifth embodiment, it is possible to avoid an occurrence of the charge-up effect in an exposure to electron beams because the surface of the upper resist film 31 is charged by positive ions.

FIGS. 7A to 7I are sectional views respectively illustrating a method for forming a multi-layer resist pattern in accordance with a sixth embodiment of the present invention. In FIGS. 7A to 7I, elements corresponding to those in FIGS. 2A to 2I are denoted by the same reference numerals.

Figure 7A:
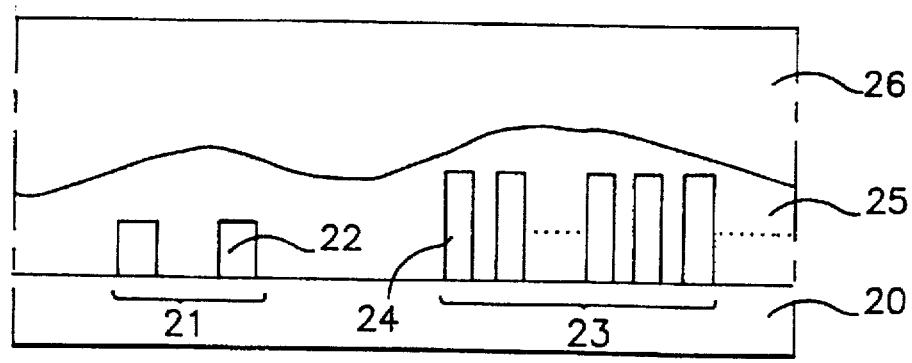
FIGS. 7A to 7I are sectional views respectively illustrating a method for forming a multi-layer resist pattern in accordance with a sixth embodiment of the present invention.
Figure 7B:
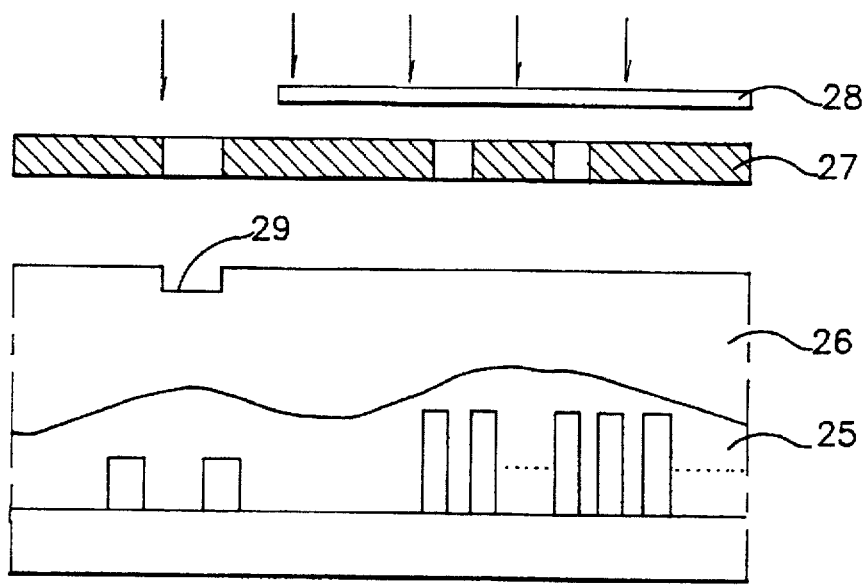
Figure 7C:
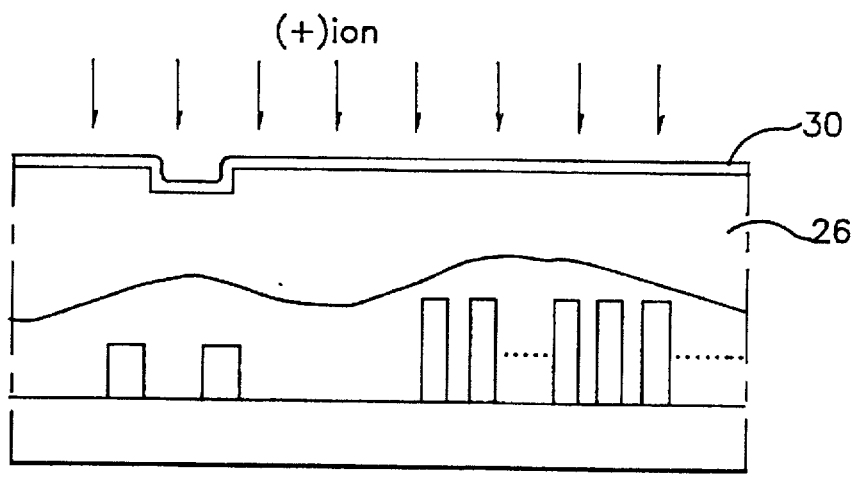
Figure 7D:
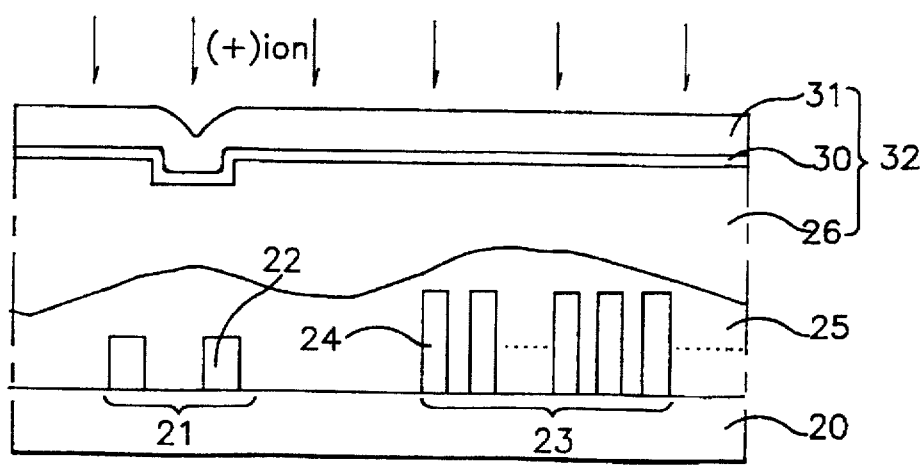
Figure 7E:
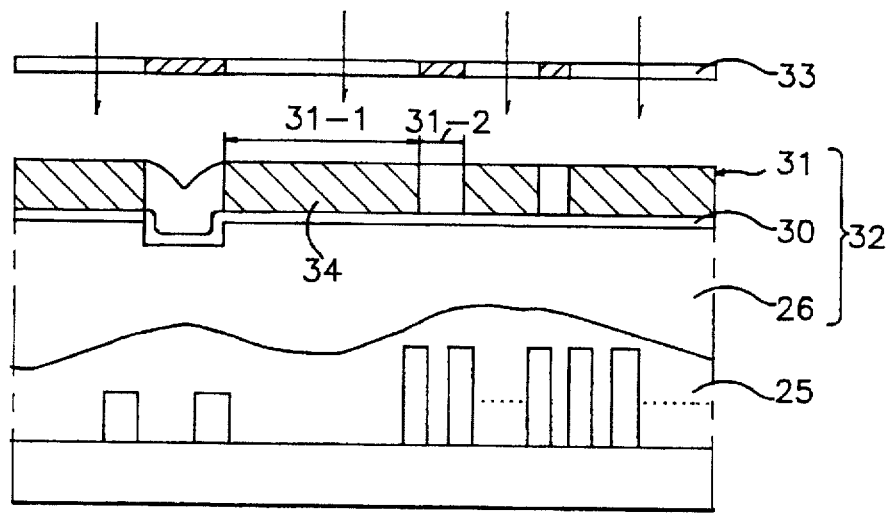
Figure 7F:
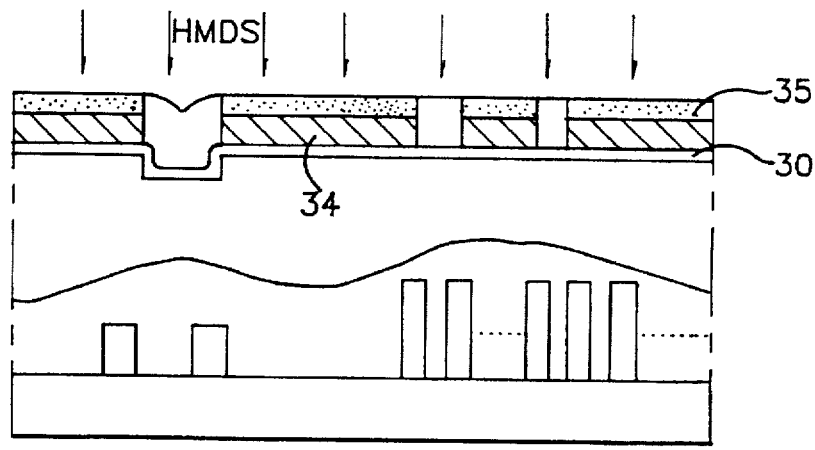
Figure 7G:
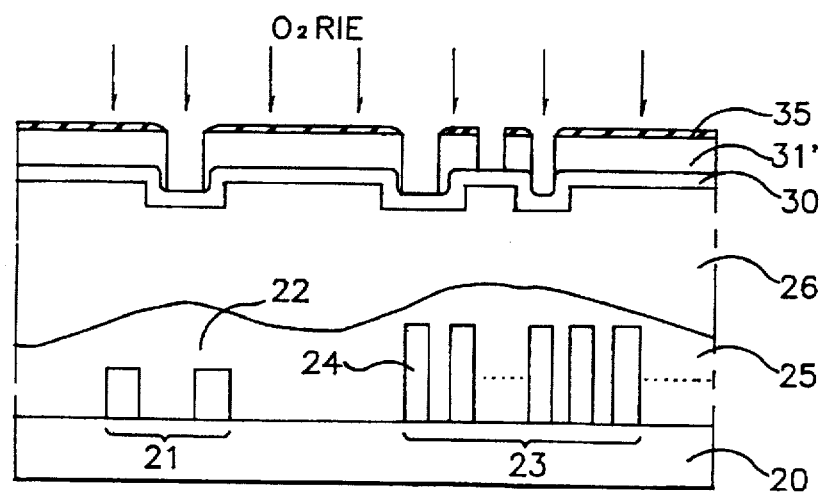
Figure 7H:
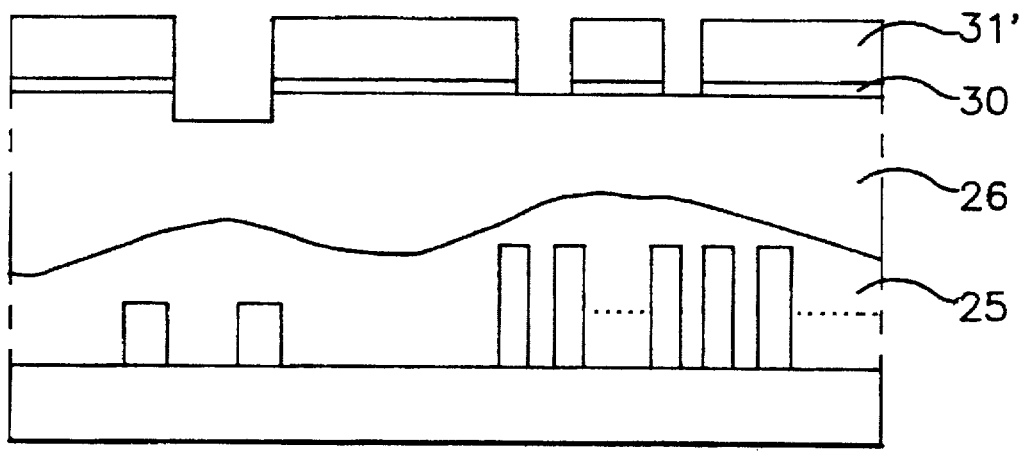
Figure 7I:
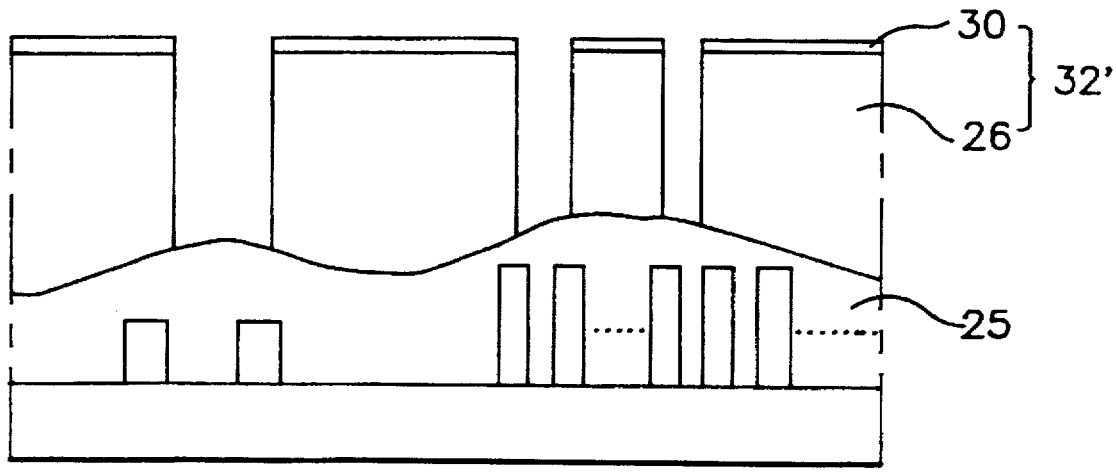

In accordance with this method, positive ions are charged in the surface of the intermediate insulating layer 30, as shown in FIG. 7C. An MLR film 32 is then formed by coating an upper resist film 31 over the intermediate insulating layer 30 in the same manner as in the first embodiment. Thereafter, the surface of the upper resist film 31 is charged by positive ions, as shown in FIG. 7D.

Subsequent steps are the same as those of the first embodiment.

The sixth embodiment is similar to the fifth embodiment. In accordance with the sixth embodiment, an occurrence of the charge-up effect in an exposure to electron beams is avoided by charging the surface of the upper resist film 31 by positive ions.

Although the above-mentioned embodiments of the present invention have been described as being associated with a positive organic resist film, a negative organic resist film may be used. In this case, a latent image pattern 34 is formed at the non-exposed part 31-2 of the upper resist film 31. A silylated layer 35 is also formed on the surface of the non-exposed part 31-2. In the dry etching using the $O_2$ RIE process., the exposed part 31-1 of the upper resist film 31 is selectively removed.

Where an exposure to ultraviolet rays and deep ultraviolet rays is carried out in the steps of forming alignment marks on the lower resist film and forming a pattern of the upper resist film, the masks 27 and 33 for the exposure are used. In this case, it is unnecessary to charge the intermediate insulating layer 30, the upper resist film 31 and the lower resist film 26 by positive ions.

In an exposure to electron beams, however, the masks 27 and 33 for the exposure are not used. In this case, a direct writing is carried out. As mentioned above, the intermediate insulating layer 30, the upper resist film 31 and the lower resist film 26 are charged by positive ions, in order to avoid an occurrence of the charge-up effect in the exposure.

As apparent from the above description, the present invention provides the following effects.

First, since alignment marks are formed on the lower resist film as well as the substrate, it is possible to achieve a multi-key alignment in a light exposure of the upper resist film and reduce errors in alignment detect. As a result, an improvement in alignment can be obtained.

Second, it is possible to avoid an occurrence of the charge-up effect in an exposure to electron beams by positively charging surfaces of the lower resist film, the intermediate layer and the upper resist film or interfaces between the lower resist film and the intermediate insulating layer and between the upper resist film and the intermediate insulating layer.

Third, since the silylation is carried out after the light exposure of the upper resist film, it is possible to obtain improvements in resonance and profile and thus effectively improve the integration degree.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a multi-layer resist pattern, comprising the steps of:

forming at least one primary alignment mark on a silicon substrate adjacent a cell part including a plurality of cell patterns having steps;

depositing a lower film over said silicon substrate;

coating a lower resist film over said lower film;

subjecting said lower resist film to a light exposure and development step, thereby forming at least one secondary alignment mark;

forming an intermediate insulating layer over said lower resist film;

implanting positive ions in said intermediate insulating layer such that the surface of the intermediate insulating layer is charged with said positive ions, so as to prevent an occurrence of a charge-up effect in exposure to electron beams;

coating an upper resist film over said intermediate insulating layer, thereby forming a multi-layer resist film;

subjecting said upper resist film to a light exposure step, thereby forming a latent image pattern at an exposed portion of said upper resist film;

subjecting the resulting structure to a silylation step, thereby forming a silylation layer at said upper resist film;

etching said upper resist film to form an upper resist pattern and removing said silylation layer;

patterning the intermediate insulating layer by using said upper resist pattern as a mask to form a patterned intermediate insulating layer; and etching said lower resist film by using said patterned intermediate insulating layer as a mask, wherein said etching of each said upper and lower resist films is carried out by a direct writing of electron beams.

2. A method in accordance with claim 1, wherein said positive ions are $O_2^+$ ions.

3. A method in accordance with claim 2, wherein said implantation of said $O_2^+$ ions is carried out under a condition using a pressure of 300 to 700 mT, a high frequency power of 100 to 700 W and a temperature of 25° C.

4. A method in accordance with claim 1, wherein said positive ions are $H^+$ ions.

5. A method in accordance with claim 4, wherein said implantation of said $H^+$ ions is carried out under a condition using an accelerated voltage of 10 to 70 kV and a dose amount of $1\times10^{14}$ to $1\times10^{18}$ ions/cm².

6. A method for forming a multi-layer resist pattern, comprising the steps of:

forming at least one primary alignment mark on a silicon substrate adjacent a cell part including a plurality of cell patterns having steps;

depositing a lower film over said silicon substrate;

coating a lower resist film over said lower film;

subjecting said lower resist film to a light exposure and development step, thereby forming at least one secondary alignment mark;

implanting positive ions in said lower resist film such that the surface of the lower resist film is charged with said positive ions;

forming an intermediate insulating layer over said lower resist film;

coating an upper resist film over said intermediate insulating layer, thereby forming a multi-layer resist film;

subjecting said upper resist film to a light exposure, thereby forming a latent image pattern at an exposed portion of said upper resist film;

subjecting the resulting structure to a silylation step, thereby forming a silylation layer at said upper resist film;

etching said upper resist film to form an upper resist pattern and removing said silylation layer;

patterning the intermediate insulating layer by using said upper resist pattern as a mask to form a patterned intermediate insulating layer; and etching said lower resist film by using said patterned intermediate insulating layer as a mask, wherein said etching of each said upper and lower resist films is carried out by a direct writing of electron beams.

7. A method for forming a multi-layer resist pattern, comprising the steps of:

forming at least one primary alignment mark on a silicon substrate adjacent a cell part including a plurality of cell patterns having steps;

depositing a lower film over said silicon substrate;

coating a lower resist film over said lower film;

subjecting said lower resist film to a light exposure and development step, thereby forming at least one secondary alignment mark;

forming an intermediate insulating layer over said lower resist film;

coating an upper resist film over said intermediate insulating layer, thereby forming a multi-layer resist film;

implanting positive ions in said upper resist film such that the surface of the upper resist film is charged with said positive ions;

subjecting said upper resist film to a light exposure, thereby forming a latent image pattern at an exposed portion of said upper resist film;

subjecting the resulting structure to a silylation step, thereby forming a silylation layer at said upper resist film;

etching said upper resist film to form an upper resist pattern and removing said silylation layer;

patterning the intermediate insulating layer by using said upper resist pattern as a mask to form a patterned intermediate insulating layer; and etching said lower resist film by using said patterned intermediate insulating layer as a mask, wherein said etching of each said upper and lower resist films is carried out by a direct writing of electron beams.

8. A method for forming a multi-layer resist pattern, comprising the steps of:

forming at least one primary alignment mark on a silicon substrate adjacent a cell part including a plurality of cell patterns having steps;

depositing a lower film over said silicon substrate;

coating a lower resist film over said lower film;

subjecting said lower resist film to a light exposure and development step, thereby forming at least one secondary alignment mark;

implanting positive ions in said lower resist film such that the surface of the lower resist film is charged with said positive ions;

forming an intermediate insulating layer over said lower resist film;

implanting positive ions in said intermediate insulating layer such that the surface of the intermediate insulating layer is charged with said positive ions;

coating an upper resist film over said intermediate insulating layer, thereby forming a multi-layer resist film;

subjecting said upper resist film to a light exposure, thereby forming a latent image pattern at an exposed portion of said upper resist film;

subjecting the resulting structure to a silylation step, thereby forming a silylation layer at said upper resist film;

etching said upper resist film to form an upper resist pattern and removing said silylation layer;

patterning the intermediate insulating layer by using said upper resist pattern as a mask to form a patterned intermediate insulating layer; and etching said lower resist film by using said patterned intermediate insulating layer as a mask, wherein said etching of each said upper and lower resist films is carried out by a direct writing of electron beams.

9. A method for forming a multi-layer resist pattern, comprising the steps of:

forming at least one primary alignment mark on a silicon substrate adjacent a cell part including a plurality of cell patterns having steps;

depositing a lower film over said silicon substrate;

coating a lower resist film over said lower film;

subjecting said lower resist film to a light exposure and development step, thereby forming at least one secondary alignment mark;

forming an intermediate insulating layer over said lower resist film;

implanting positive ions in said intermediate insulating layer such that the surface of the intermediate insulating layer is charged with said positive ions;

coating an upper resist film over said intermediate insulating layer, thereby forming a multi-layer resist film;

implanting positive ions in said upper resist film such that the surface of the upper resist film is charged with said positive ions;

subjecting said upper resist film to a light exposure, thereby forming a latent image pattern at an exposed portion of said upper resist film;

subjecting the resulting structure to a silylation step, thereby forming a silylation layer at said upper resist film;

etching said upper resist film to form an upper resist pattern and removing said silylation layer;

patterning the intermediate insulating layer by using said upper resist pattern as a mask to form a patterned intermediate insulating layer; and etching said lower resist film by using said patterned intermediate insulating layer as a mask, wherein said etching of each said upper and lower resist films is carried out by a direct writing of electron beams.

* * * * *